(12) United States Patent
Kuo et al.

(10) Patent No.: US 11,444,615 B2
(45) Date of Patent: Sep. 13, 2022

(54) TERMINATION CIRCUIT

(71) Applicant: Novatek Microelectronics Corp., Hsinchu (TW)

(72) Inventors: Liang-Ting Kuo, Tainan (TW); Chih-Yuan Kung, Kaohsiung (TW); Kuan-Ting Lin, Tainan (TW); Chu-Wei Hsia, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 17/163,559

(22) Filed: Feb. 1, 2021

(65) Prior Publication Data

US 2022/0247402 A1 Aug. 4, 2022

(51) Int. Cl.
*H03K 17/0812* (2006.01)
*H04L 25/02* (2006.01)

(52) U.S. Cl.
CPC ... *H03K 17/08122* (2013.01); *H04L 25/0298* (2013.01)

(58) Field of Classification Search
CPC ............ H03K 17/08122; H04L 25/0298

USPC ........................................................ 327/546
See application file for complete search history.

(56) References Cited

U.S. PATENT DOCUMENTS

2012/0262200 A1* 10/2012 Shin ............... H03K 19/017545
326/30

* cited by examiner

*Primary Examiner* — Metasebia T Retebo
(74) *Attorney, Agent, or Firm* — JCIPRNET

(57) ABSTRACT

A termination circuit, including a termination resistor, a first switch circuit, a second switch circuit, and a control circuit, is provided. A first end of the termination resistor is coupled to a signal pad. A first end of the first switch circuit is coupled to a second end of the termination resistor. A first end of the second switch circuit is coupled to a second end of the first switch circuit. A second end of the second switch circuit is coupled to a reference voltage line. During a period when the second switch circuit is turned on, the control circuit turns on the first switch circuit with a bias voltage. During a period when the second switch circuit is turned off, the control circuit turns off the first switch circuit with a voltage of the first end of the first switch circuit.

9 Claims, 3 Drawing Sheets

TERMINATION CIRCUIT

BACKGROUND

Technical Field

The disclosure relates to an integrated circuit, and particularly relates to a termination circuit in the integrated circuit.

Description of Related Art

Generally, the high-speed transmission interface of the integrated circuit (IC) is configured with the termination circuit to match the impedance of the transmission channel. With the evolution of the manufacturing process, the supply voltage of the integrated circuit is getting smaller and smaller, that is, the voltage range that may be tolerated by elements (such as a transistor) in the integrated circuit is getting smaller and smaller. For example, the tolerance voltage of a transistor with 22 nm process is 3.3V, but the tolerance voltage of a transistor with 12 nm process is only 1.8V. The input voltage range of the integrated circuit would be easily higher than the tolerance voltage of the elements in the advanced process node. As such, the voltage across the transistor in the termination circuit may exceed the tolerable voltage range of the transistor, which causes electrical overstress and/or increased leakage current of the transistor.

SUMMARY

The disclosure provides a termination circuit to prevent issues of electrical overstress and/or leakage current from happening as much as possible.

In an embodiment of the disclosure, the termination circuit includes a termination resistor, a first switch circuit, a second switch circuit, and a control circuit. A first end of the termination resistor is adapted to be coupled to a signal pad. A first end of the first switch circuit is coupled to a second end of the termination resistor. A first end of the second switch circuit is coupled to a second end of the first switch circuit. A second end of the second switch circuit is coupled to a reference voltage line. The second switch circuit is controlled by a control signal. The control circuit is configured to control the first switch circuit. During a period when the control signal turns on the second switch circuit, the control circuit transmits a bias voltage to a control end of the first switch circuit to turn on the first switch circuit. During a period when the control signal turns off the second switch circuit, the control circuit transmits a voltage of the first end of the first switch circuit to the control end of the first switch circuit to turn off the first switch circuit.

Based on the above, the control circuit and the first switch circuit according to the embodiments of the disclosure may be self-biased. For example, when the second switch circuit is turned off, the control circuit may transmit the voltage of the first end of the first switch circuit to the control end of the first switch circuit to turn off the first switch circuit. When the second switch circuit is turned on, the control circuit may transfer the bias voltage (above 0V) to the control end of the first switch circuit to turn on the first switch circuit. The termination circuit may prevent issues of electrical overstress and/or leakage current from happening as much as possible.

In order for the features and advantages of the disclosure to be more comprehensible, the following specific embodiments are described in detail in conjunction with the accompanying drawings.

DETAILED DESCRIPTION OF DISCLOSED EMBODIMENTS

Figure 1:
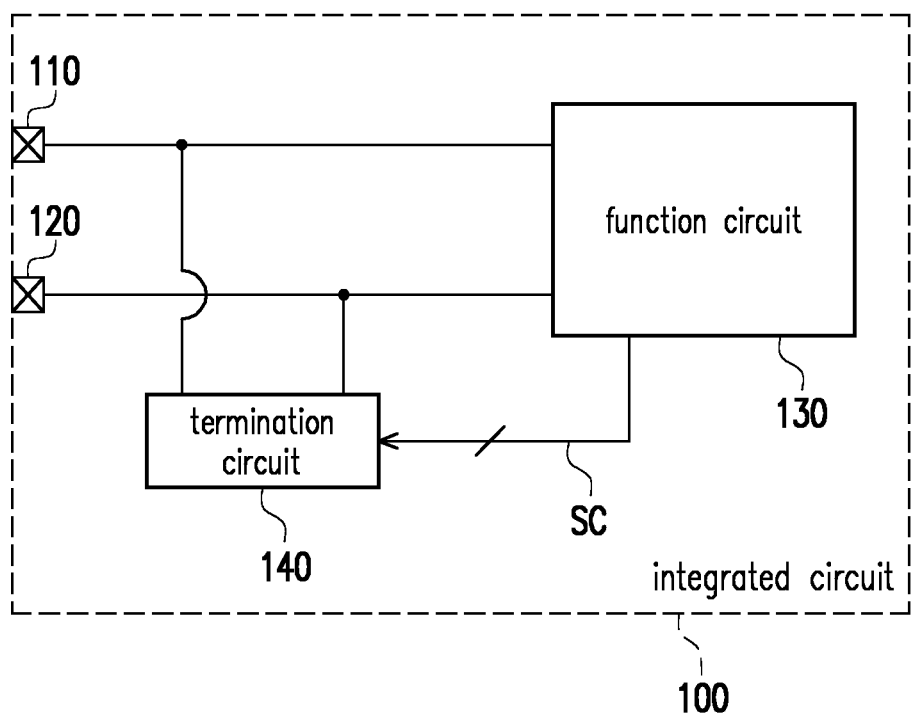
FIG. 1 is a schematic diagram of a circuit block of an integrated circuit according to an embodiment of the disclosure.

The term "coupling (or connection)" used in the entire specification (including the claims) of the present application may refer to any direct or indirect connection means. For example, if a first device is described as being coupled (or connected) to a second device, it should be interpreted that the first device may be directly connected to the second device or the first device may be indirectly connected to the second device through another device or certain connection means. Terms such as "first" and "second" mentioned in the entire specification (including the claims) of the present application are used to name the elements or to distinguish between different embodiments or ranges, but not to limit the upper limit or lower limit of the number of elements or to limit the sequence of the elements. In addition, wherever possible, elements/components/steps using the same reference numerals in the drawings and embodiments represent the same or similar parts. Relevant descriptions in different embodiments may be made with reference to each other for elements/components/steps using the same reference numerals or using the same terminologies.

FIG. 1 is a schematic diagram of a circuit block of an integrated circuit (IC) 100 according to an embodiment of the disclosure. The integrated circuit 100 shown in FIG. 1 includes a signal pad 110, a signal pad 120, a function circuit 130, and a termination circuit 140. The function circuit 130 may receive a differential signal from the outside of the integrated circuit 100 through the signal pads 110 and 120, and/or the function circuit 130 may output the differential signal to the outside of the integrated circuit 100 through the signal pads 110 and 120. The peak voltage level of a signal of the signal pad 110 (or 120) is higher than a supply voltage VDD of the integrated circuit 100. For example, the supply voltage VDD of the integrated circuit 100 is 1.8V, and the peak voltage level of the signal of the signal pad 110 (or 120) may be 3V.

The termination circuit 140 is adapted to be configured in the integrated circuit 100. The termination circuit 140 may match the impedance of the transmission channel (including the signal pads 110 and 120). The function circuit 130 may generate a control signal SC according to actual operation to set/control the termination resistor value of the termination circuit 140. Based on the control signal SC of the function circuit 130, the termination circuit 140 may provide an appropriate termination impedance to the transmission channel (including the signal pads 110 and 120).

Figure 2:
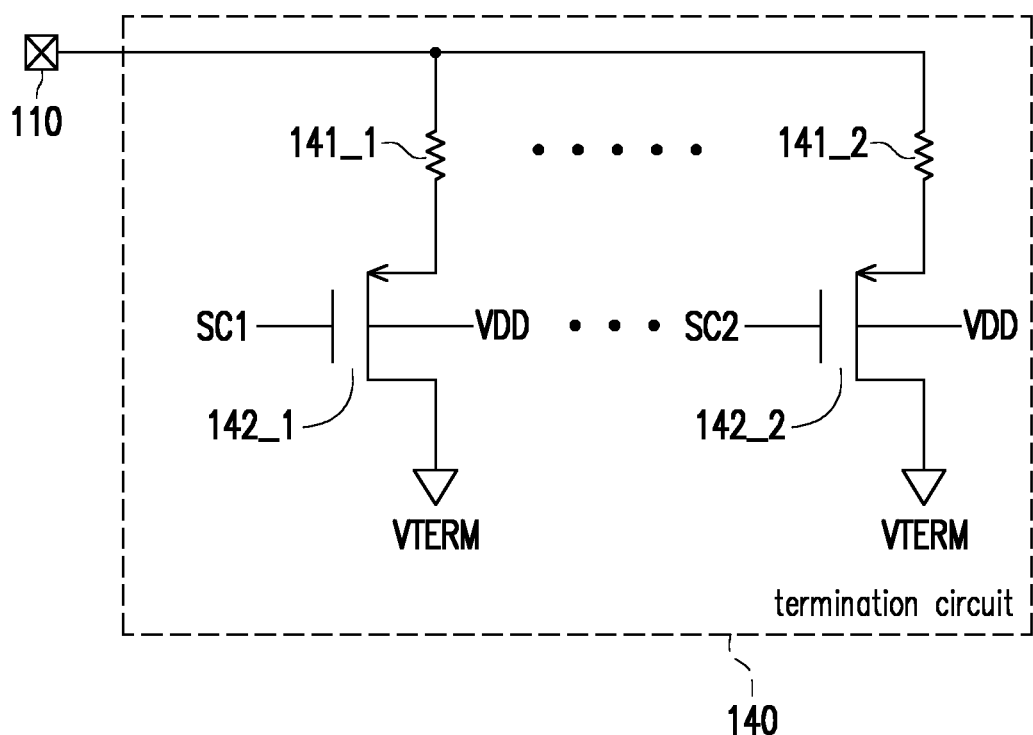
FIG. 2 is a schematic diagram of a circuit block illustrating a termination circuit shown in FIG. 1 according to an embodiment.

FIG. 2 is a schematic diagram of a circuit block illustrating the termination circuit 140 shown in FIG. 1 according to an embodiment. The termination circuit 140 shown in FIG. 2 includes multiple termination resistors (such as termination resistors 141_1 and 141_2) and multiple transistors (such as transistors 142_1 and 142_2). The number of termination resistors and the number of transistors may be determined according to actual design. First ends of the termination resistors 141_1 and 141_2 are coupled to the signal pad 110. The source of the transistor 142_1 is coupled to a second end of the termination resistor 141_1. The bulk of the transistor 142_1 is coupled to the supply voltage VDD of the integrated circuit 100. The source of transistor 142_2 is coupled to a second end of the termination resistor 141_2. The drains of the transistors 142_1 and 142_2 are coupled to a reference voltage line VTERM. The bulks of the transistors 142_1 and 142_2 are coupled to the supply voltage VDD of the integrated circuit 100.

The resistance values of the termination resistors 141_1 and 141_2 may be determined according to actual design. In the embodiment shown in FIG. 2, the control signal SC includes a control signal SC1 and a control signal SC2. The function circuit 130 may generate the control signal SC1 and the control signal SC2 to control the transistors 142_1 and 142_2 according to actual operation, so as to set the termination resistor value of the termination circuit 140.

In the case where the signal of the signal pad 110 is one end of the differential signal, the voltage of the reference voltage line VTERM may be the middle voltage of the differential signal, such as the common mode voltage. Therefore, the voltage swing range of the signal of the signal pad 110 is from VTERM+Vswing to VTERM−Vswing, where Vswing is half of the voltage swing range of the signal of the signal pad 110. Here, it is assumed that VTERM−Vswing is greater than 0V, that is, VTERM is greater than Vswing. Hereinafter, the termination resistor 141_1 and the transistor 142_1 will be taken as illustrative examples. Other termination resistors and other transistors (such as the termination resistor 141_2 and the transistor 142_2) of the termination circuit 140 may be deduced by analogy with reference to the relevant descriptions of the termination resistor 141_1 and the transistor 142_1, so there will be no reiteration.

When the transistor 142_1 is turned on, the transistor 142_1 may experience electrical overstress. For example, it is assumed that the voltage of the signal pad 110 is 3V, the supply voltage VDD of the integrated circuit 100 is 1.8V, and the voltage of the reference voltage line VTERM is 1.8V. When the control signal SC1 is 0V, the transistor 142_1 is turned on. When the transistor 142_1 is turned on, it is assumed that the drain-source voltage (generally referred to as Vds) of the transistor 142_1 is 0.2V, that is, the source voltage of the transistor 142_1 is 2V. Therefore, the gate-source voltage (generally referred to as Vgs) of the transistor 142_1 is 2V. The Vgs (2V) of the transistor 142_1 is greater than the supply voltage VDD (1.8V), so the turned-on transistor 142_1 will have the issue of electrical overstress.

In order to prevent the issue of electrical overstress from happening as much as possible, the source voltage of the transistor 142_1 should be less than the supply voltage VDD. Assuming that the voltage of the signal of the signal pad 110 is VTERM±Vswing, the source voltage of the transistor 142_1 is VTERM±VT, where voltage VT is (Vswing*R2)/(R1+R2), R1 is the resistance value of the termination resistor 141_1, and R2 is the resistance value of the turned-on transistor 142_1. In order to prevent electrical overstress from happening, VTERM+VT should be less than the supply voltage VDD.

When the control signal SC1 is pulled up to 1.8V to turn off the transistor 142_1, the transistor 142_1 may leak current. For example, it is assumed that the voltage of the signal pad 110 is 3V, the supply voltage VDD of the integrated circuit 100 is 1.8V, and the voltage of the reference voltage line VTERM is 1.8V. When the control signal SC1 is pulled up to 1.8V to turn off the transistor 142_1, the source voltage of the transistor 142_1 is close to the voltage (3V) of the signal pad 110. Since the source-gate voltage (generally referred to as Vsg, that is, 3-1.8=1.2) of the transistor 142_1 is greater than the critical voltage, current may flow from the source to the drain. In addition, since the source voltage of the transistor 142_1 is greater than the bulk voltage of the transistor 142_1, current may flow from the source to the bulk.

In order to prevent leakage current from happening as much as possible, the source voltage of the transistor 142_1 should be less than the supply voltage VDD. Assuming that the voltage of the signal of the signal pad 110 is VTERM±Vswing, when the control signal SC1 is pulled up, the source voltage of the transistor 142_1 is approximately VTERM±Vswing. In order to prevent leakage current from happening, VTERM+Vswing should be less than the supply voltage VDD.

Figure 3:
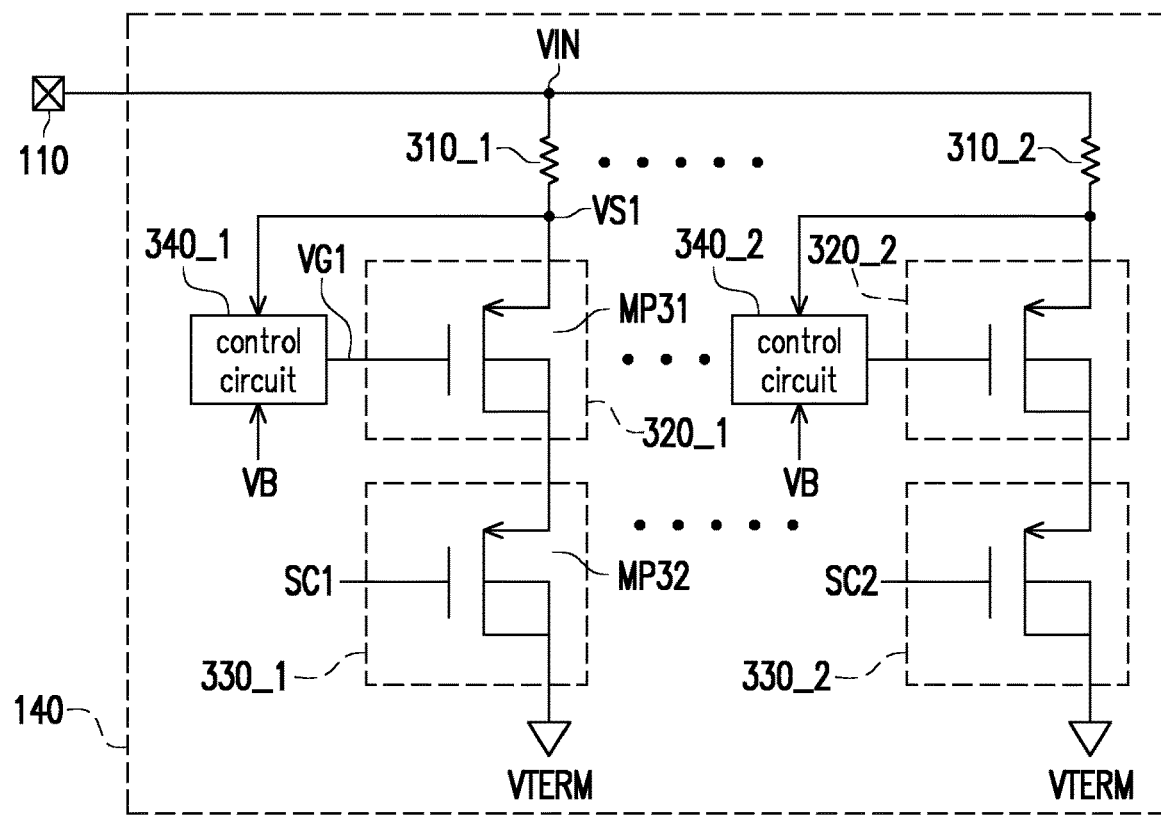
FIG. 3 is a schematic diagram of a circuit block illustrating the termination circuit shown in FIG. 1 according to an embodiment of the disclosure.

FIG. 3 is a schematic diagram of a circuit block illustrating the termination circuit 140 shown in FIG. 1 according to an embodiment of the disclosure. The termination circuit 140 shown in FIG. 3 includes multiple termination resistors (such as termination resistors 310_1 and 310_2), multiple first switch circuits (such as first switch circuits 320_1 and 320_2), multiple second switch circuits (such as second switch circuits 330_1 and 330_2), and multiple control circuits (such as control circuits 340_1 and 340_2). The number of termination resistors, the number of first switch circuits, the number of second switch circuits, and the number of control circuits may be determined according to actual design.

First ends of the termination resistors 310_1 and 310_2 are adapted to be coupled to the signal pad 110. A first end of the first switch circuit 320_1 is coupled to a second end of the termination resistor 310_1. A first end of the second switch circuit 330_1 is coupled to a second end of the first switch circuit 320_1. A first end of the first switch circuit 320_2 is coupled to a second end of the termination resistor 310_2. A first end of the second switch circuit 330_2 is coupled to a second end of the first switch circuit 320_2. The second ends of the second switch circuits 330_1 and 330_2 are coupled to the reference voltage line VTERM.

The resistance values of the termination resistors 310_1 and 310_2 may be determined according to actual design. In the embodiment shown in FIG. 3, the control signal SC includes the control signal SC1 and the control signal SC2. The second switch circuit 330_1 is controlled by the control signal SC1, and the second switch circuit 330_2 is controlled by the control signal SC2. The function circuit 130 may generate the control signal SC1 and the control signal SC2 according to actual operation to control the transistors 330_1 and 330_2, so as to set the termination resistor value of the termination circuit 140. The voltage swing ranges of the control signals SC1 and SC2 may be determined according to actual design. For example, the voltage swing ranges of the control signals SC1 and SC2 may be from a bias voltage VB to the supply voltage VDD. The bias voltage VB may be determined according to actual design. For example, the bias voltage VB may be a fixed voltage greater than 0V. For another example, the bias voltage VB may be greater than the voltage VT. Assuming that the voltage VTERM±Vswing of the signal of the signal pad 110 is VIN, and in the case where the first switch circuit 320_1 and the second switch circuit 330_1 are turned on, the difference between the voltages of the two ends of the termination resistor 310_1 is the voltage drop VIN−VS1, and the difference between the voltage VIN of the signal pad 110 and the voltage of the reference voltage line VTERM is the voltage difference VIN−VTERM, the voltage VT may be the difference value between the voltage difference VIN−VTERM and the voltage drop VIN−VS1 (that is, VS1−VTERM).

Hereinafter, the termination resistor 310_1, the first switch circuit 320_1, the second switch circuit 330_1, and the control circuit 340_1 will be taken as illustrative examples. Other termination resistors, other first switch circuits, other second switch circuits, and other control circuits (such as the termination resistor 310_2, the first switch circuit 320_2, the second switch circuit 330_2, and the control circuit 340_2) of the termination circuit 140 shown in FIG. 3 may be deduced by analogy with reference to the relevant descriptions of the termination resistor 310_1, the first switch circuit 320_1, the second switch circuit 330_1, and the control circuit 340_1, so there will be no reiteration.

The control circuit 340_1 may output a control signal VG1 to control the first switch circuit 320_1. During the period when the control signal SC1 turns on the second switch circuit 330_1, the control circuit 340_1 may transmit the bias voltage VB (low logic level, but higher than 0V) as the control signal VG1 to the control end of the first switch circuit 320_1 to turn on the first switch circuit 320_1. During the period when the control signal SC1 turns off the second switch circuit 330_1, the control circuit 340_1 may transmit a voltage VS1 of the first end of the first switch circuit 320_1 as the control signal VG1 to the control end of the first switch circuit 320_1 to turn off the first switch circuit 320_1. Therefore, the control circuit 340_1 and the first switch circuit 320_1 may be self-biased.

In the embodiment shown in FIG. 3, the first switch circuit 320_1 includes a transistor MP31. The gate of the transistor MP31 is coupled to the control circuit 340_1 to receive the control signal VG1. The source of transistor MP31 is coupled to the second end of the termination resistor 310_1. The drain of the transistor MP31 is coupled to the first end of the second switch circuit 330_1. The bulk of the transistor MP31 is coupled to the drain of the transistor MP31. In the embodiment shown in FIG. 3, the second switch circuit 330_1 includes a transistor MP32. The source of the transistor MP32 is coupled to the second end of the first switch circuit 320_1. The drain of the transistor MP32 is coupled to the reference voltage line VTERM. The bulk of the transistor MP32 is coupled to the drain of the transistor MP32.

The gate of the transistor MP32 is controlled by the control signal SC1. When the control signal SC1 is the supply voltage VDD to turn off the transistor MP32, the control circuit 340_1 may transmit the source voltage of the transistor MP31 as the control signal VG1 to the gate of the transistor MP31 to turn off the transistor MP31. That is, the gate voltage of the transistor MP31 may follow the source voltage of the transistor MP31, so that the transistor MP31 may be reliably turned off to prevent leakage current from happening as much as possible.

When the control signal SC1 is the bias voltage VB to turn on the transistor MP32, the control circuit 340_1 may transmit the bias voltage VB (low logic level, but higher than 0V) as the control signal VG1 to the gate of the transistor MP31 to turn on the transistor MP31. Assuming that a voltage VIN of the signal of the signal pad 110 is VTERM±Vswing, the source voltage of the transistor MP31 is VTERM±VT, where the voltage VT is VS1−VTERM. The gate-source voltage (Vgs) of the transistor MP31 is VS1−VB. The bias voltage VB is greater than the voltage VT, and the voltage VT may be VS1−VTERM, so Vgs of the transistor MP31 is less than VS1−VT=VS1−(VS1−VTERM)=VTERM. The voltage of the reference voltage line VTERM is less than the supply voltage VDD, so Vgs of the transistor MP31 is less than the supply voltage VDD. By analogy, when the control signal SC1 is the bias voltage VB, Vgs of the transistor MP32 is also less than the supply voltage VDD. Therefore, the transistors MP31 and MP32 may prevent electrical overstress from happening.

Figure 4:
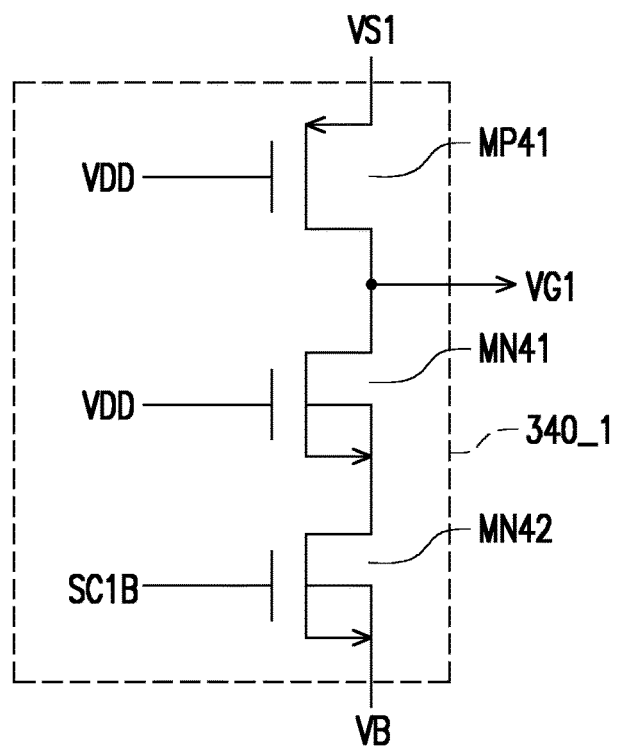
FIG. 4 is a schematic diagram of a circuit block illustrating a control circuit shown in FIG. 3 according to an embodiment of the disclosure.

FIG. 4 is a schematic diagram of a circuit block illustrating the control circuit 340_1 shown in FIG. 3 according to an embodiment of the disclosure. The other control circuit (such as the control circuit 340_2) of the termination circuit 140 shown in FIG. 3 may be deduced by analogy with reference to the relevant description of the control circuit 340_1 shown in FIG. 4, so there will be no reiteration. The control circuit 340_1 shown in FIG. 4 includes a transistor MP41, a transistor MN41, and a transistor MN42. The source of the transistor MP41 is coupled to the first end of the first switch circuit 320_1 to receive the voltage VS1. The drains of the transistor MP41 and the transistor MN41 are coupled to the control end of the first switch circuit 320_1 to provide the control signal VG1. The gates of the transistor MP41 and the transistor MN41 are coupled to the supply voltage VDD. The bulk of the transistor MN41 is coupled to the source of the transistor MN41. The gate of the transistor MN42 is adapted to receive an inverted signal SC1B of the control signal SC1. The drain of the transistor MN42 is coupled to the source of the transistor MN41. The source of the transistor MN42 is adapted to receive the bias voltage VB. The bulk of the transistor MN42 is coupled to the source of the transistor MN42.

During the period when the control signal SC1 turns on the second switch circuit 330_1, the reverse signal SC1B may turn on the transistor MN42, so that the bias voltage VB may be transmitted to the control end of the first switch circuit 320_1 through the transistor MN42 and the transistor MN41. The bias voltage VB as the control signal VG1 may turn on the first switch circuit 320_1, so that the voltage VS1 is pulled down. The pulled-down voltage VS1 will reduce the gate-source voltage (Vgs) of the transistor MP41, so that the transistor MP41 is turned off.

During the period when the control signal SC1 turns off the second switch circuit 330_1, the inverted signal SC1B may turn off the transistor MN42. In addition, since the second switch circuit 330_1 is turned off, the voltage VS1 is pulled up close to the voltage VIN (for example, 3V) of the signal of the signal pad 110. The pulled-up voltage VS1 will increase the gate-source voltage (Vgs) of the transistor MP41, so that the transistor MP41 is turned on. Therefore, the voltage VS1 of the first end of the first switch circuit 320_1 may be transmitted to the control end of the first switch circuit 320_1 through the transistor MP41. That is, the voltage (the control signal VG1) of the control end of the first switch circuit 320_1 may follow the voltage VS1 of the first end of the first switch circuit 320_1, so that the first switch circuit 320_1 may be reliably turned off to prevent leakage current from happening as much as possible.

Figure 5:
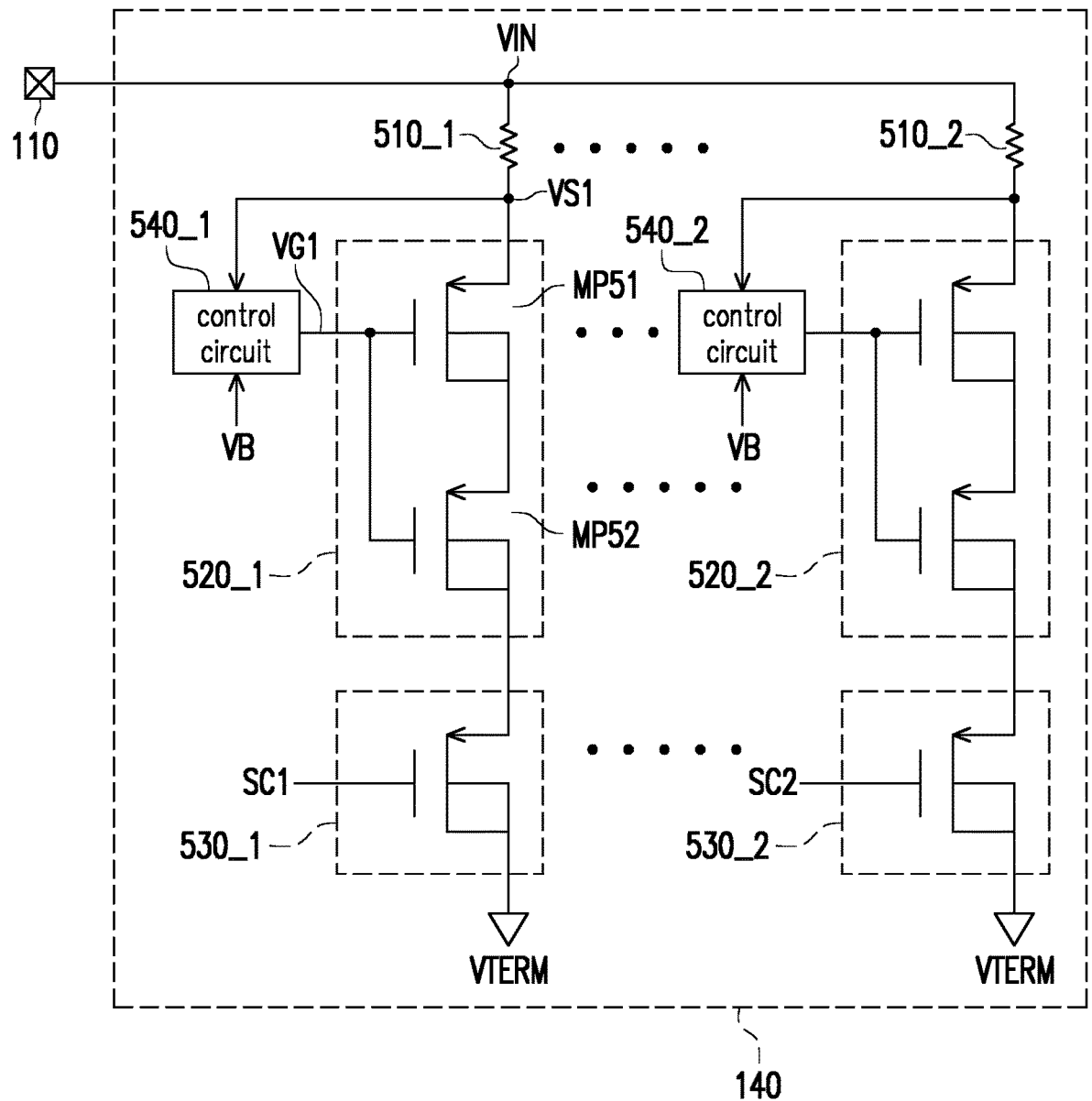
FIG. 5 is a schematic diagram of a circuit block illustrating the termination circuit shown in FIG. 1 according to another embodiment of the disclosure.

FIG. 5 is a schematic diagram of a circuit block illustrating the termination circuit 140 shown in FIG. 1 according to another embodiment of the disclosure. The termination circuit 140 shown in FIG. 5 includes multiple termination resistors (such as termination resistors 510_1 to 510_2), multiple first switch circuits (such as first switch circuits 520_1 to 520_2), multiple second switch circuits (such as second switch circuits 530_1 to 530_2), and multiple control circuits (such as control circuits 540_1 to 540_2). The termination resistor 510_1, the termination resistor 510_2, the first switch circuit 520_1, the first switch circuit 520_2, the second switch circuit 530_1, the second switch circuit 530_2, the control circuit 540_1, and the control circuit 540_2 shown in FIG. 5 may be deduced by analogy with reference to the relevant descriptions of the termination resistor 310_1, the termination resistor 310_2, the first switch circuit 320_1, the first switch circuit 320_2, the second switch circuit 330_1, the second switch circuit 330_2, the control circuit 340_1, and the control circuit 340_2, so there will be no reiteration. The control circuit 540_1 and the control circuit 540_2 shown in FIG. 5 may be deduced by analogy with reference to the relevant description of the control circuit 340_1 shown in FIG. 4, so there will be no reiteration.

Hereinafter, the first switch circuit 520_1 will be taken as an illustrative example. The other first switch circuit (such as the first switch circuit 520_2) of the termination circuit 140 shown in FIG. 5 may be deduced by analogy with reference to the relevant description of the first switch circuit 520_1, so there will be no reiteration.

In the embodiment shown in FIG. 5, the first switch circuit 520_1 includes a transistor MP51 and a transistor MP52. The gates of the transistor MP51 and the transistor MP52 are coupled to the control circuit 540_1 to receive the control signal VG1. The source of the transistor MP51 is coupled to the second end of the termination resistor 510_1. The bulk of the transistor MP51 is coupled to the drain of the transistor MP51. The source of the transistor MP52 is coupled to the drain of the transistor MP51. The drain of the transistor MP52 is coupled to the first end of the second switch circuit 530_1. The bulk of the transistor MP52 is coupled to the drain of the transistor MP52.

The number of transistors in the first switch circuit 520_1 may be determined according to actual design. For example, in other embodiments, the first switch circuit 520_1 may include three (or more) transistors, and the transistors are connected in series (which may be deduced by analogy with reference to the transistor MP51 and the transistor MP52 shown in FIG. 5).

In summary, the termination circuit 140 according to the foregoing embodiments may use the control circuit and the first switch circuit to implement self-bias. For example, when the second switch circuit is turned off, the control circuit may transmit the voltage of the first end of the first switch circuit to the control end of the first switch circuit to turn off the first switch circuit. When the second switch circuit is turned on, the control circuit may transmit the bias voltage VB (low logic level, but higher than 0V) to the control end of the first switch circuit to turn on the first switch circuit. The termination circuit 140 may prevent issues of electrical overstress and/or leakage current from happening as much as possible.

Although the disclosure has been disclosed in the above embodiments, the above embodiments are not intended to limit the disclosure. Persons skilled in the art may make some changes and modifications without departing from the spirit and scope of the disclosure. The scope protection of the disclosure shall be determined by the scope of the appended claims.

What is claimed is:

1. A termination circuit, comprising:
   a termination resistor, having a first end coupled to a signal pad;
   a first switch circuit, having a first end coupled to a second end of the termination resistor;
   a second switch circuit, having a first end coupled to a second end of the first switch circuit, wherein a second end of the second switch circuit is coupled to a reference voltage line, and the second switch circuit is controlled by a control signal; and
   a control circuit, configured to control the first switch circuit, wherein
   during a period when the control signal turns on the second switch circuit, the control circuit transmits a bias voltage to a control end of the first switch circuit to turn on the first switch circuit; and
   during a period when the control signal turns off the second switch circuit, the control circuit transmits a voltage of the first end of the first switch circuit to the control end of the first switch circuit to turn off the first switch circuit.

2. The termination circuit according to claim 1, wherein the termination circuit is adapted to be configured in an integrated circuit, and a peak voltage level of a signal of the signal pad is higher than a supply voltage of the integrated circuit.

3. The termination circuit according to claim 1, wherein a voltage swing range of the control signal is from the bias voltage to a supply voltage.

4. The termination circuit according to claim 1, wherein the bias voltage is greater than 0V.

5. The termination circuit according to claim 4, wherein in a case where the first switch circuit and the second switch circuit are turned on, a difference between voltages of two ends of the termination resistor is a voltage drop, a difference between voltage of the signal pad and voltage of the reference voltage line is a voltage difference, and the bias voltage is greater than a difference value between the voltage difference and the voltage drop.

6. The termination circuit according to claim 1, wherein the first switch circuit comprises:
   a transistor, having a gate coupled to the control circuit, wherein a source of the transistor is coupled to the second end of the termination resistor, a drain of the transistor is coupled to the first end of the second switch circuit, and a bulk of the transistor is coupled to the drain of the transistor.

7. The termination circuit according to claim 1, wherein the first switch circuit comprises:
   a first transistor, having a gate coupled to the control circuit, wherein a source of the first transistor is coupled to the second end of the termination resistor, and a bulk of the first transistor is coupled to a drain of the first transistor; and
   a second transistor, having a gate coupled to the control circuit, wherein a source of the second transistor is coupled to the drain of the first transistor, a drain of the second transistor is coupled to the first end of the second switch circuit, and a bulk of the second transistor is coupled to the drain of the second transistor.

8. The termination circuit according to claim 1, wherein the second switch circuit comprises:
   a transistor, having a gate controlled by the control signal, wherein a source of the transistor is coupled to the second end of the first switch circuit, a drain of the transistor is coupled to the reference voltage line, and a bulk of the transistor is coupled to the drain of the transistor.

9. The termination circuit according to claim 1, wherein the control circuit comprises:
   a first transistor, having a gate coupled to a supply voltage, wherein a source of the first transistor is coupled to the first end of the first switch circuit, and a drain of the first transistor is coupled to the control end of the first switch circuit;
   a second transistor, having a gate coupled to the supply voltage, wherein a drain of the second transistor is coupled to the control end of the first switch circuit, and a bulk of the second transistor is coupled to a source of the second transistor; and
   a third transistor, having a gate adapted to receive an inverted signal of the control signal, wherein a drain of the third transistor is coupled to the source of the second transistor, a source of the third transistor is adapted to receive the bias voltage, and a bulk of the third transistor is coupled to the source of the third transistor.

* * * * *